United States Patent
Ku et al.

(10) Patent No.: US 10,747,277 B2
(45) Date of Patent: Aug. 18, 2020

(54) LAPTOP COMPUTER WITH INTEGRAL COOLING

(71) Applicant: Intel Corporation, Santa Clara, CA (US)

(72) Inventors: Jeff Ku, Taipei (TW); Shantanu D Kulkarni, Hillsboro, OR (US); Gavin Sung, Taipei (TW)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/226,360

(22) Filed: Dec. 19, 2018

(65) Prior Publication Data
US 2019/0129480 A1     May 2, 2019

(51) Int. Cl.
  *G06F 1/20* (2006.01)
  *H05K 7/20* (2006.01)
(52) U.S. Cl.
  CPC ......... *G06F 1/203* (2013.01); *H05K 7/20145* (2013.01); *H05K 7/20509* (2013.01)
(58) Field of Classification Search
  None
  See application file for complete search history.

(56) References Cited

U.S. PATENT DOCUMENTS

| | | | | | |
|---|---|---|---|---|---|
| 5,621,613 | A | * | 4/1997 | Haley | G06F 1/203 165/104.33 |
| 5,718,282 | A | * | 2/1998 | Bhatia | F28D 15/02 165/104.33 |
| 6,175,493 | B1 | * | 1/2001 | Gold | G06F 1/203 174/15.2 |
| 6,771,498 | B2 | * | 8/2004 | Wang | G06F 1/203 165/104.33 |
| 6,816,371 | B2 | * | 11/2004 | Agata | G06F 1/203 165/121 |
| 7,288,895 | B2 | * | 10/2007 | Rossi | G06F 1/20 315/112 |
| 7,558,062 | B2 | * | 7/2009 | Wang | G06F 1/203 165/185 |
| 9,268,377 | B2 | * | 2/2016 | MacDonald | G06F 1/1681 |
| 9,740,253 | B2 | * | 8/2017 | Cheng | G06F 1/203 |
| 2004/0042171 | A1 | * | 3/2004 | Takamatsu | G06F 1/203 361/679.48 |
| 2006/0005549 | A1 | * | 1/2006 | Ishinabe | F25B 21/02 62/3.2 |
| 2015/0124398 | A1 | * | 5/2015 | Kirkpatrick | H05K 7/20136 361/679.48 |

* cited by examiner

*Primary Examiner* — Courtney L Smith
(74) *Attorney, Agent, or Firm* — Schwabe, Williamson & Wyatt, P.C.

(57) ABSTRACT

System and method for transferring heat generated by internal electronic components of a mobile computer to its external environment. Heat absorption and transfer elements disposed, in part, proximate heat-producing components move the heat to a remote heat sink assembly adapted to dissipate the heat. Example embodiments include one or more fans to produce internal airflow(s) that further facilitate internal heat transfer.

16 Claims, 8 Drawing Sheets

LAPTOP COMPUTER WITH INTEGRAL COOLING

BACKGROUND

The present disclosure relates to removal of internally generated heat from a mobile computer, and more particularly, to a system for transferring heat generated by internal electronic components of a mobile computer to its external environment.

A personal computer (PC) is versatile for many and varied uses, including gaming. However, gaming poses significant challenges for PC design and construction, perhaps the largest of which is cooling so as to maintain internal components at operating temperatures that do not unduly limit the life or performance of the PC. For example, accommodating for thermal assembly considerations may require positioning the keyboard at the front edge of the PC case and thereby introduce ergonomic problems with typing and control which hamper the gaming experience of the user. Also, cooling requirements for a gaming laptop PC (e.g., 100 W or more) often result in thicker and heavier systems due to larger internal airflow and venting requirements, which negatively impact the system industrial design.

Other approaches involve use of external stands on which a laptop may be placed. Some may include internal fans and/or lifting mechanisms to elevate the PC to create more venting space below for airflow as well as inclination of the keyboard for typing. While these features may facilitate typing and heat dissipation, they also add weight and bulk, which negatively impact portability. Plus, fans internal to the cooling stand are only capable of externally cooling the PC chassis, which does little to address the internal operating temperatures of the components inside. While still other approaches provide additional optional openings or vents within the PC chassis, without also including more direct heat sinking or forced airflow, such additional design complexities provide little relief.

BRIEF DESCRIPTION OF THE DRAWINGS

With respect to the discussion to follow and in particular to the drawings, it is stressed that the particulars shown represent examples for purposes of illustrative discussion and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

As discussed in more detail below, a system and method provide for transferring heat generated by internal electronic components of a mobile computer to its external environment. Heat absorption and transfer elements disposed, in part, proximate heat-producing components move the heat to a remote heat sink assembly adapted to dissipate the heat. Example embodiments include one or more fans to produce internal airflow(s) that further facilitate internal heat transfer.

Figure 1A:
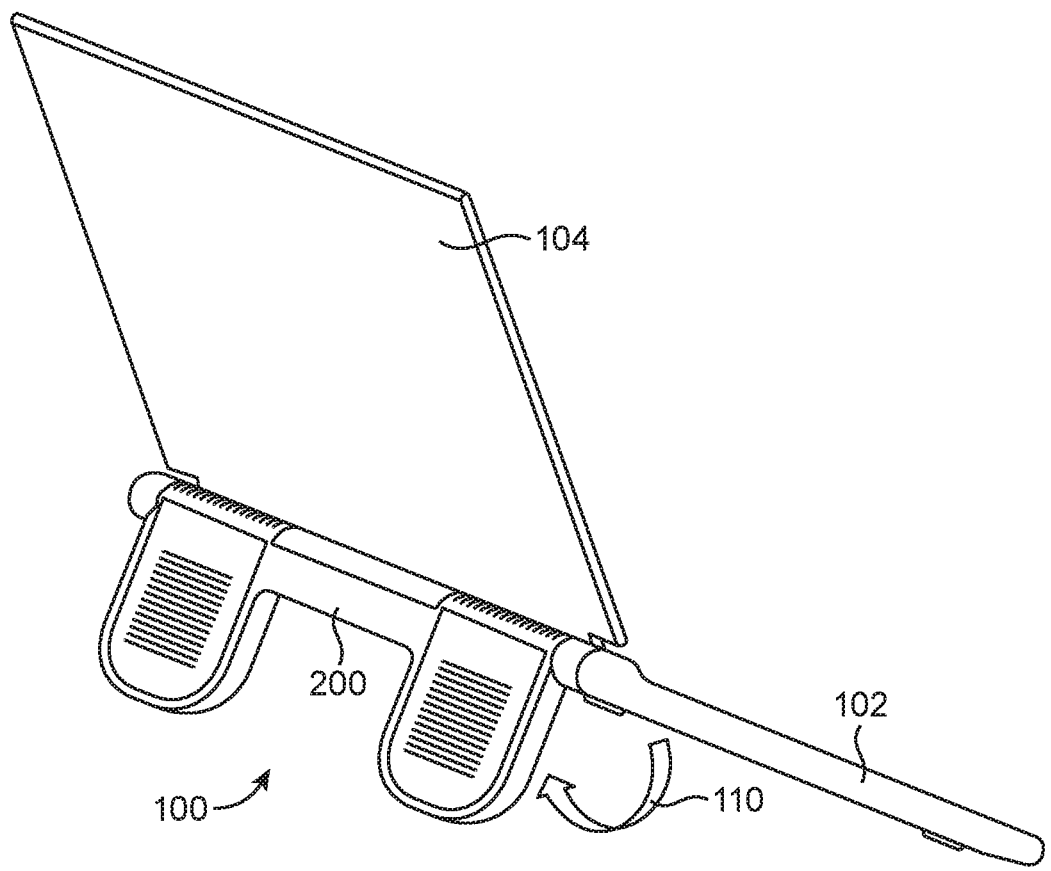
FIGS. 1A-1B illustrate rear/side and front/side views of a laptop PC with an integral cooling system in accordance with example embodiments.
Figure 1B:
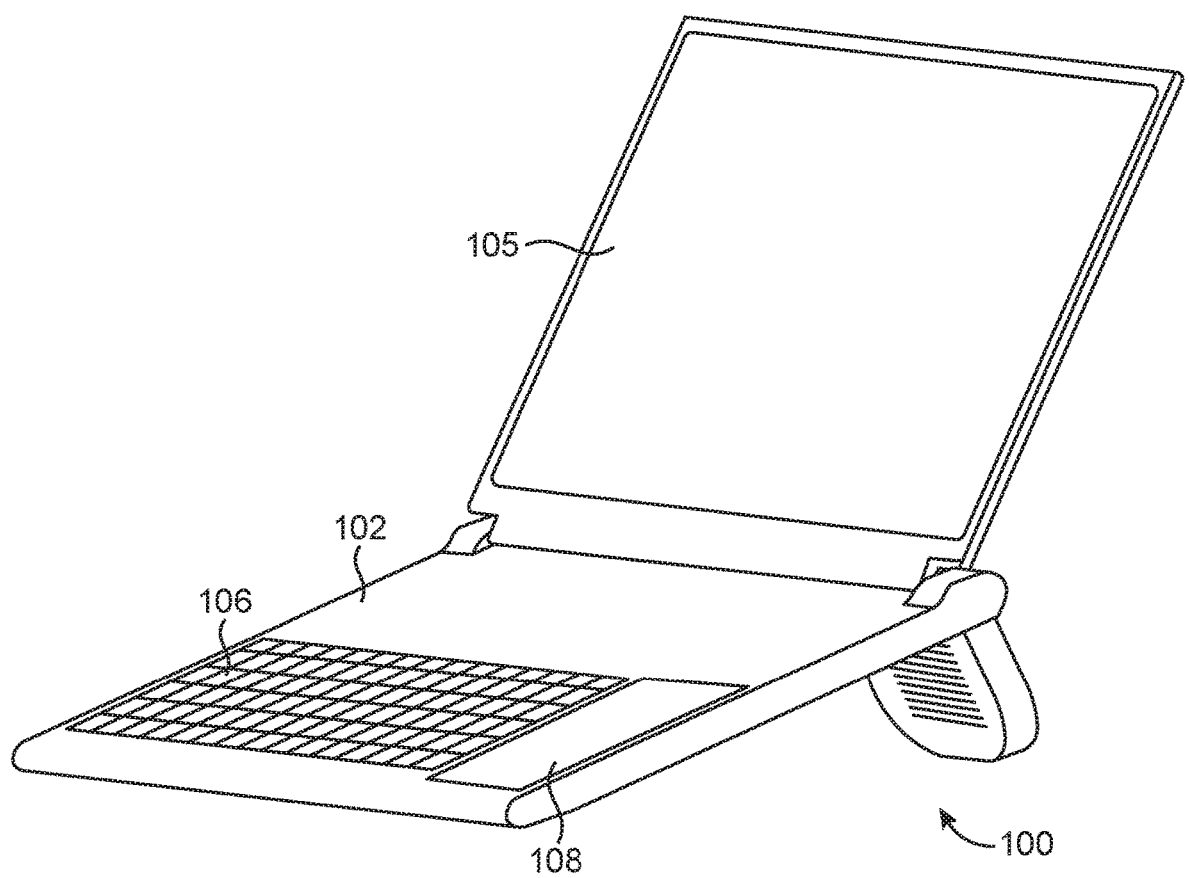

FIGS. 1A-1B illustrate rear/side (FIG. 1A) and front/side (FIG. 1B) views of a laptop PC 100 with an integral cooling system in accordance with example embodiments. The system 100 includes a cooling assembly 200 (discussed in more detail below) that is rotatable, along an arc 110, away from the bottom of the main case 102, e.g., along an axis of rotation shared with the lid 104 containing a display. As discussed in more detail below, in addition to the cooling capabilities that become enabled, this may also advantageously dispose the keyboard 106 and touchpad 108 at an angled elevation that enhances the typing and control environment for the user.

Figure 2A:
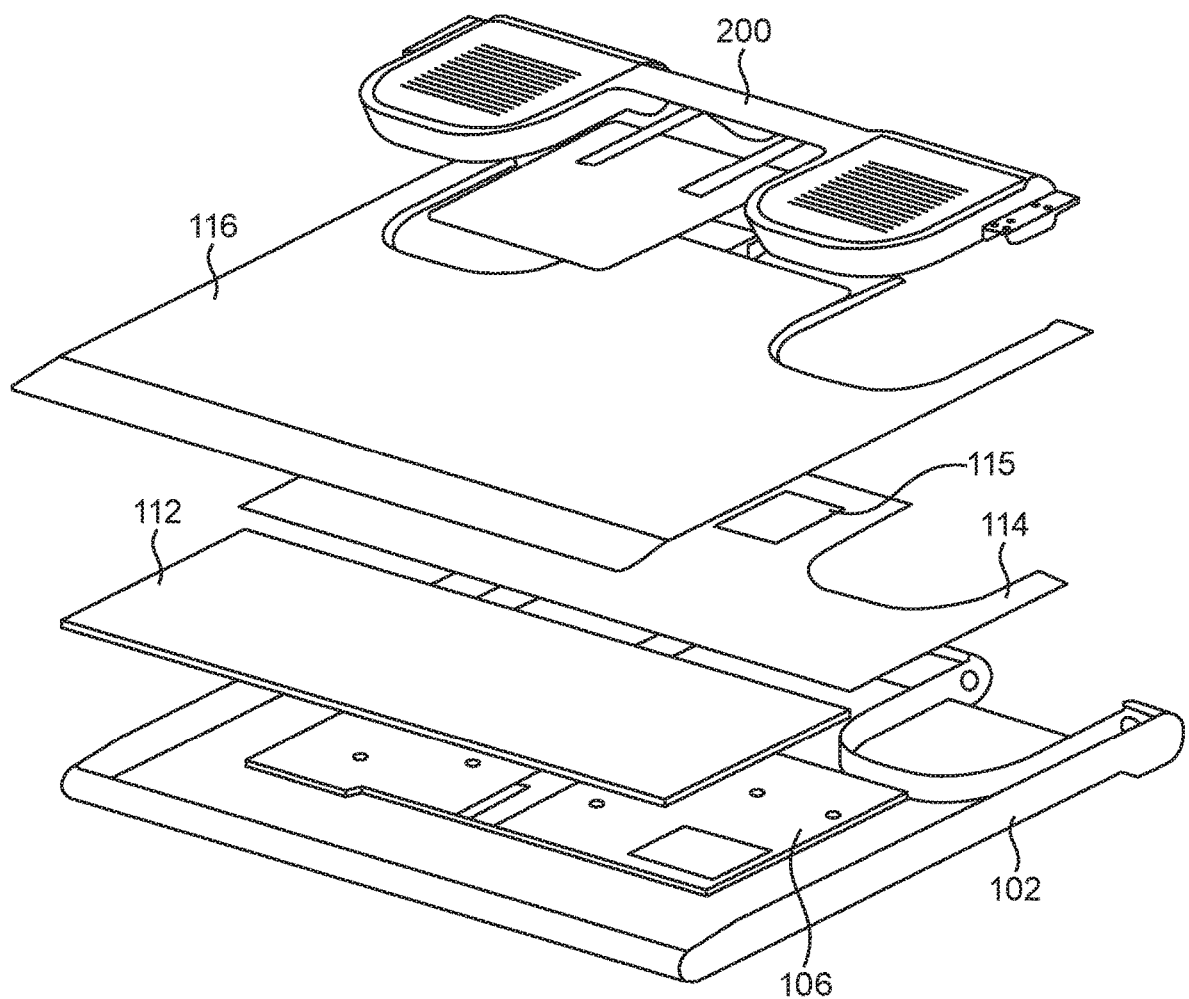
FIGS. 2A-2B illustrate exploded views of components included in an integral cooling system in accordance with example embodiments.
Figure 2B:
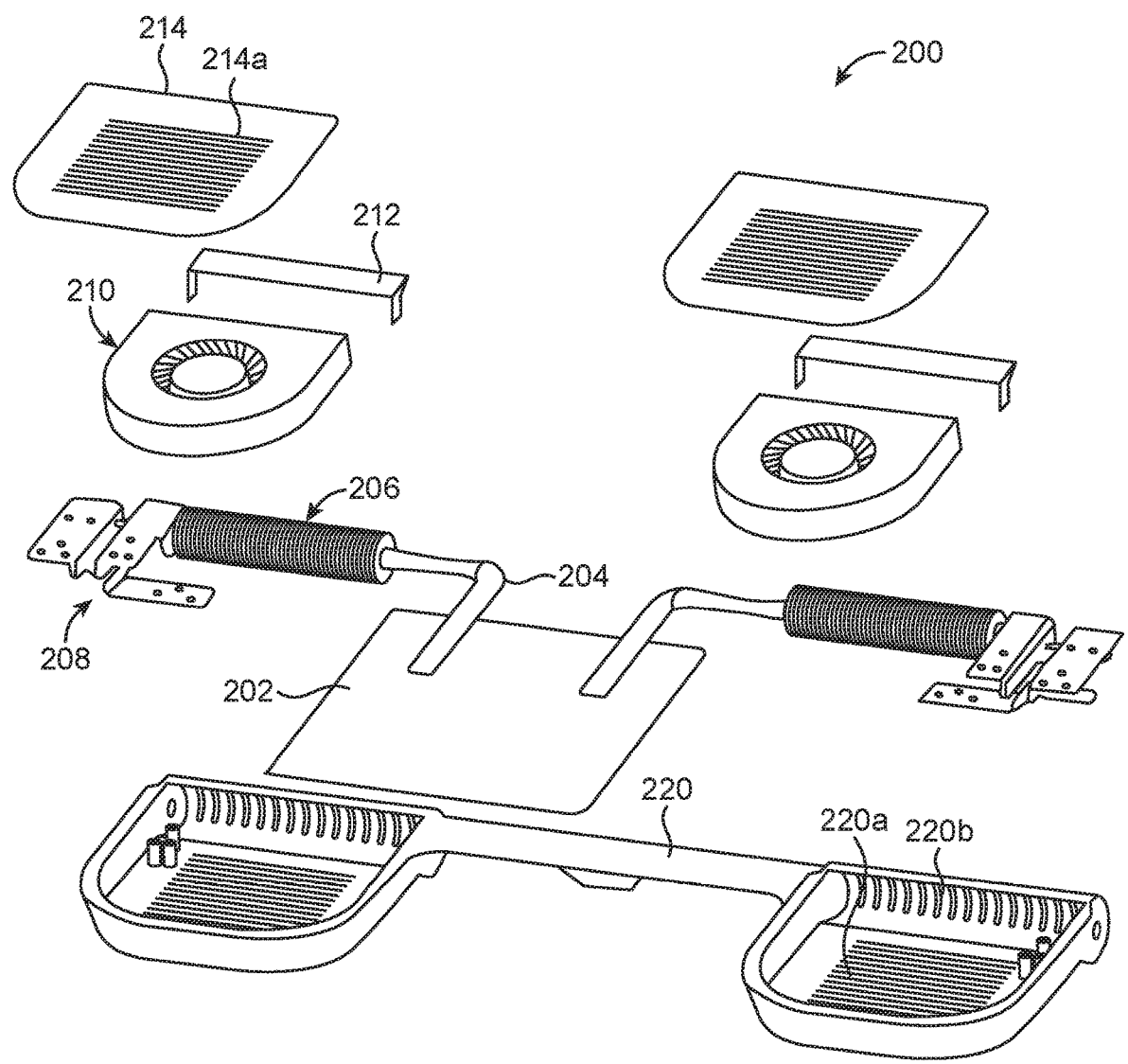

FIGS. 2A-2B illustrate exploded views of components included in an integral cooling system in accordance with example embodiments. For example, as depicted in FIG. 2A, mounted to the underside of the top of the main case 102 may be the keyboard 106, a battery 112, a cooling assembly 200, and a circuit card assembly (CCA) 114, all of which are then covered by a bottom cover 116. The CCA 114 may often be a multi-layer printed circuit card on which numerous electronic components 115 (e.g., a microprocessor and various digital logic and input/output interface circuits) may be mounted (mechanically and electrically, e.g., via solder).

Referring to FIG. 2B, in accordance with example embodiments, the cooling assembly 200 may include a stand cover 220 (which, when rotated to an open position, raises the rear of the case 102 to an elevated state and thereby inclines the keyboard 106, as seen in FIGS. 1A-1B) with front-facing vents 220a and upward-facing vents 220b to enable airflows (discussed in more detail below). Also included (and discussed in more detail below) is a hinge and heat pipe assembly having a cold plate 202, heat pipes 204, heat sink assemblies 206 and hinge assemblies 208 (e.g., for mounting the assembly to the case 102 and/or cover 104). Further included are blowers 210, which may be mounted within the stand cover 220 between the front-facing vents 220a and rear covers 214 having rear-facing vents 214a, and blower ducts 212, which may also be mounted within the stand cover 220 and act to deflect airflows of dissipated heat outwardly from the blowers 210 through the rear-facing vents 220b (discussed in more detail below).

Figure 3:
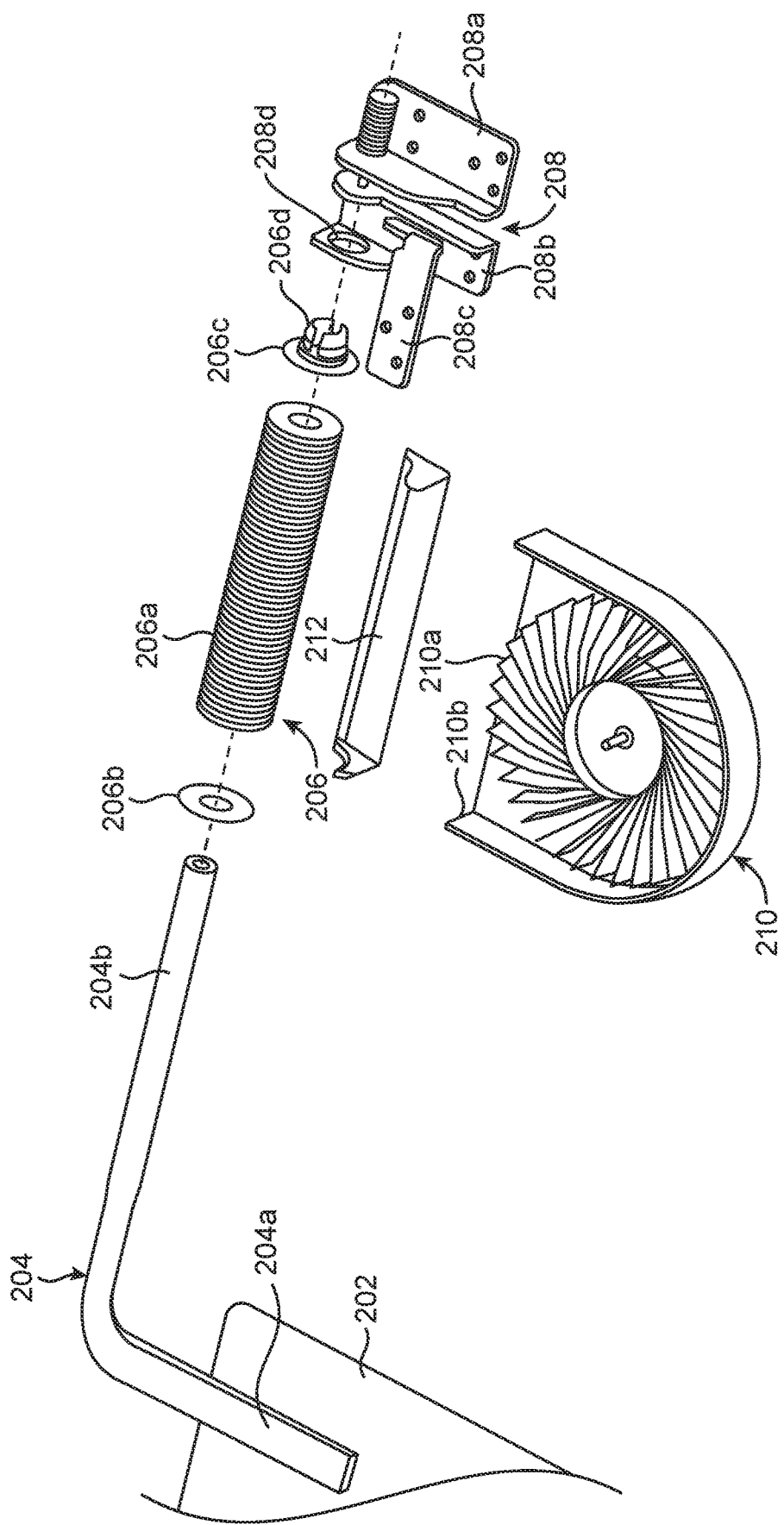
FIG. 3 illustrates components included in a heat transfer subsystem of an integral cooling system in accordance with example embodiments.

FIG. 3 illustrates components included in a heat transfer subsystem of an integral cooling system in accordance with example embodiments. The cold plate 202 is positioned proximate the CCA 114 (FIG. 2A) to be thermally coupled with a heat-producing component 115 (e.g., via mechanical contact, either directly or indirectly via an intermediate cover 116, and perhaps a thermally conductive grease or adhesive). The heat produced by the component 115 is absorbed by the cold plate 202. A proximal portion 204a of the heat pipe 204 is thermally coupled to the cold plate 202 (e.g., via a mechanical bonding process such as a solder or welding process) to conduct the absorbed heat away from the cold plate to a distal portion 204b of the heat pipe 204, which is disposed coaxially within a remote heat sink 206a (e.g., a tube having radial fins) captured between proximal 206b and distal 206c mounting disks to form the heat sink assembly 206. As noted above, a blower duct 212 may be mounted to deflect airflows of dissipated heat produced by a fan 210a within the case 210b of the blower 210. Such deflection may be directed, by the airflow produced by the spinning vanes of the fan 210a, perpendicular to the remote heat sink 206a (e.g., across and/or through the radial fins), thereby facilitating dissipation of the conducted heat from the cold plate 202 via the heat pipe 204 and remote heat sink 206a.

Figure 4:
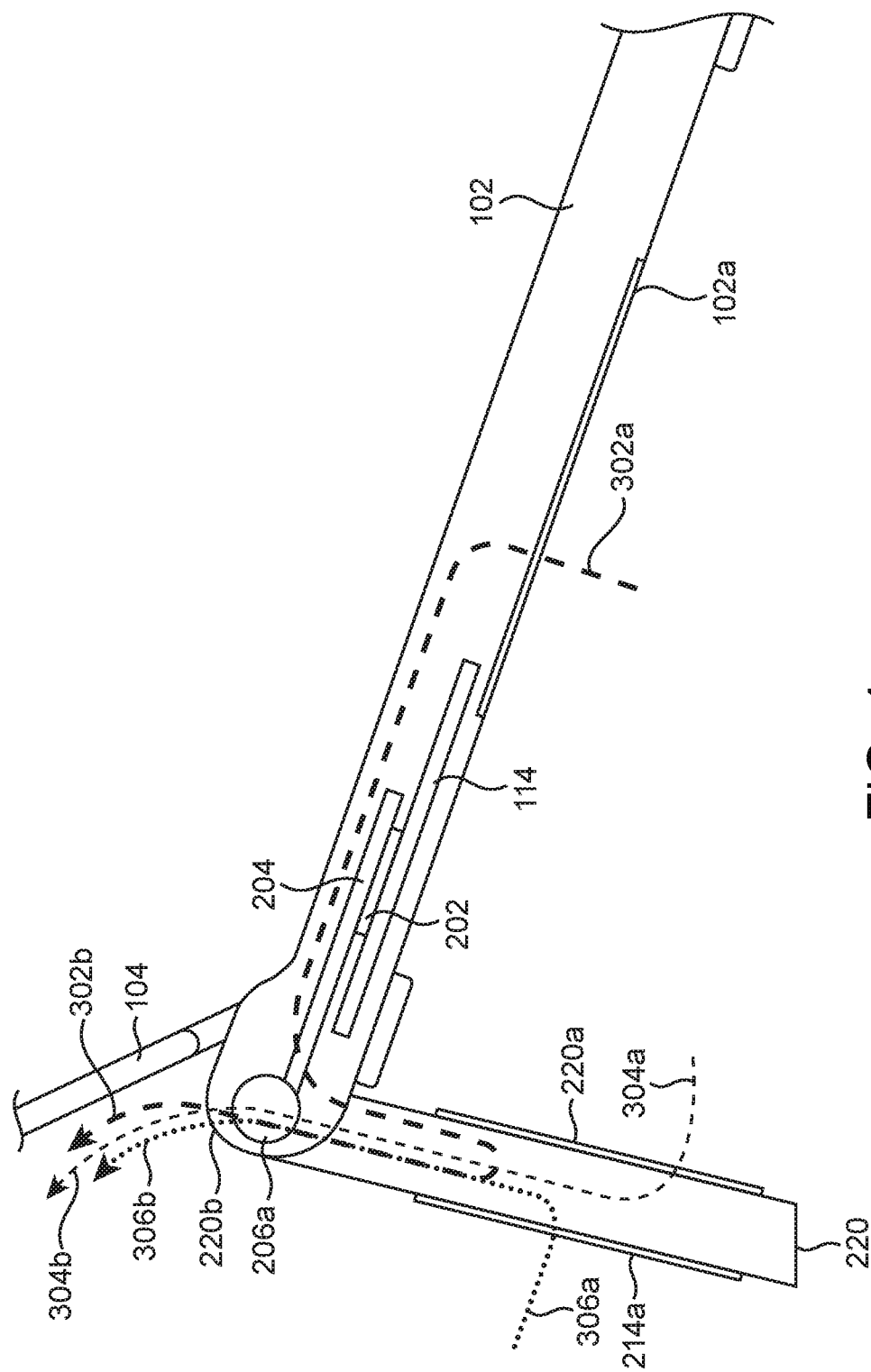
FIG. 4 illustrates a side view of cooling airflows created in a laptop PC with an integral cooling system in accordance with example embodiments.

FIG. 4 illustrates a side view of cooling airflows created in a laptop PC with an integral cooling system in accordance with example embodiments. As noted above, the spinning vanes of the fans 210a within the stand cover 220 of the cooling assembly 200 produce an airflow across and/or through the remote heat sing 206a. Such airflow may have multiple components enabled by inclusion of multiple vents or air inlets through which the action of the fans 210 pull or draw multiple incoming airflows. For example, the bottom surface of the case 102 may include a vent 102a allowing ambient air to enter the case 102 below the CCA 114. As this incoming airflow 302a enters, it is drawn by the fans 210 across and/or around the CCA 114, thereby absorbing and conducting away heat absorbed by circuit board from the heat-producing components 115 as well as directly from the components 115. Ultimately, this airflow 302a, now warmer, is drawn into the fans 210 and redirected out via the remote heat sink 206a and upward-facing vents 220b (FIG. 2B) as an outgoing, or exhaust, airflow component 302b. Similarly, the front-facing vents 220a and rear-facing vents 214a (FIG. 2B) of the cooling assembly 200 allowing ambient air to enter. These additional incoming airflows 304a, 306a mix, within the circulating airflows produced by the fans 210, with the airflow 302a warmed by the CCA 114 and are directed out via the remote heat sink 206a and upward-facing vents 220b (FIG. 2B) as additional outgoing, or exhaust, airflow components 304b, 306b.

Figure 5:
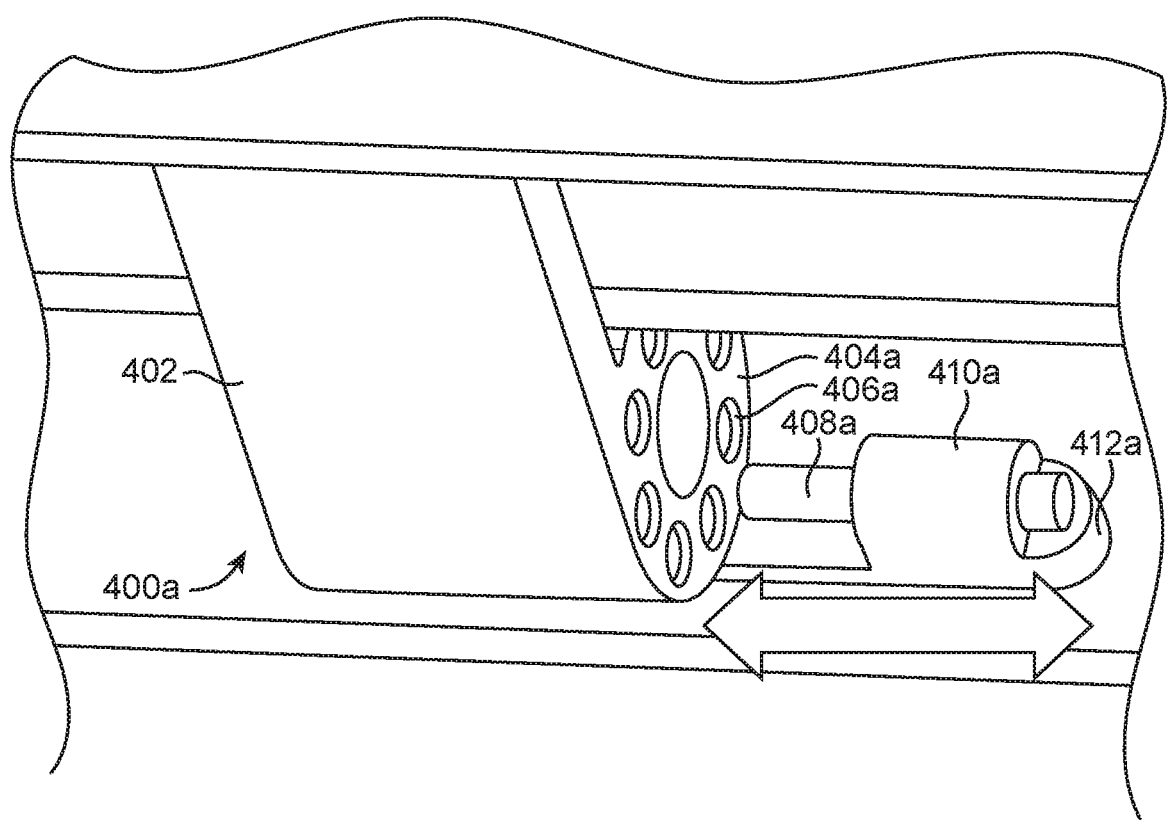
FIGS. 5-6 illustrate rotational locking mechanisms for a laptop PC with an integral cooling system in accordance with example embodiments.
Figure 6:
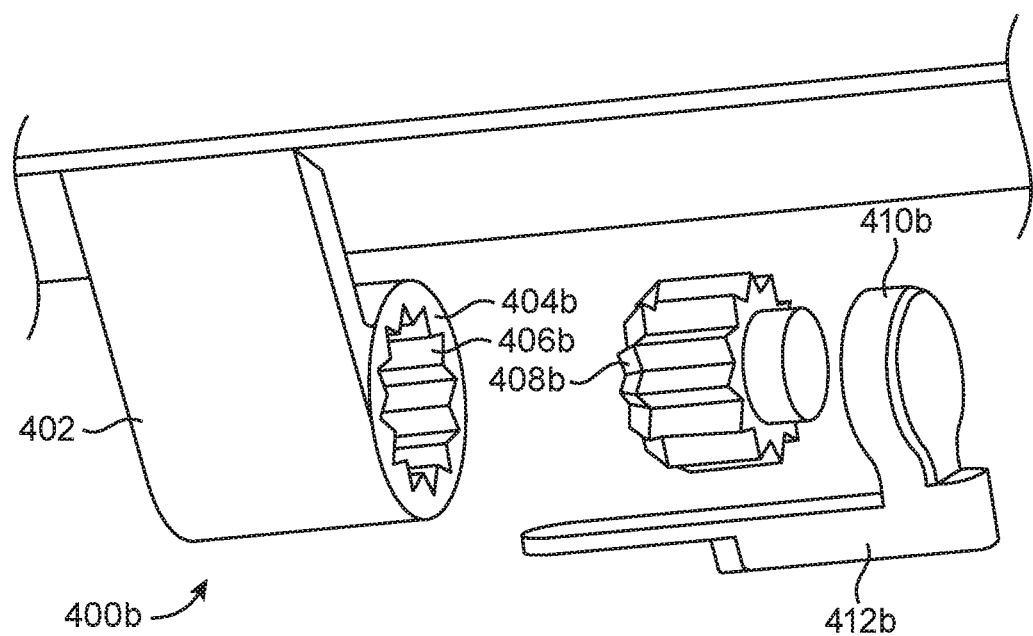

FIGS. 5-6 illustrate rotational locking mechanisms for a laptop PC with an integral cooling system in accordance with example embodiments. Both examples 400a (FIG. 5), 400b (FIG. 6) include a mounting flange 402 for affixing a receiving member 404a, 404b (e.g., receptacle) to either the case 102 or cooling assembly 200, and an engaging member 408a, 408b (e.g., plug) for movable (e.g., slidable) affixation to either the cooling assembly 200 or case 102, respectively, to establish the angle of rotation of the cooling assembly 200 relative to the case 102 when it is deployed from its stowed location within the bottom of the case 102.

In one example (FIG. 5), the receiving member 404a may be circular with a slotted surface 406a, and the engaging member 410a includes a pin 408a that may be movable (e.g., slidable) into a mating relationship with the slots 406a, thereby locking the mechanism 400a in an angle of rotation relative to the case 102. (The pin 408a may be movably captured within a housing 410a mounted on a fixed base 412a, or fixedly captured within a housing 410a mounted on a base 412a that is movably mounted to the cooling assembly 200 or case 102.) In another example (FIG. 6), the receiving member 404b may also be circular with an aperture 406b having inwardly directed radial protrusions (e.g., longitudinal splines), and the engaging member 410b includes a complimentary engaging member 408b having outwardly directed radial protrusions (e.g., longitudinal splines) that may be movable (e.g., slidable) into a mating relationship with the receiving member 404b, thereby locking the mechanism 400b in an angle of rotation relative to the case 102. (The engaging member 408b may be movably captured within a housing 410b mounted on a fixed base 412b, or fixedly captured within a housing 410b mounted on a base 412b that is movably mounted to the cooling assembly 200 or case 102.)

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the foregoing and following description and the following claims, the term "coupled" along with its derivatives, may be used. "Coupled" is used to indicate that two or more elements cooperate or interact with each other, but they may or may not have intervening physical or electrical components between them.

As used in the claims, unless otherwise specified, the use of the ordinal adjectives "first", "second", "third", etc., to describe a similar element, merely indicate that different instances of such elements are being recited, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of operation described herein may be changed and are not limited to the manner described herein. Moreover, actions of any operation flow need not be implemented in the order described, nor do all actions necessarily need to be performed. Also, those actions that are not dependent on other actions may be performed in parallel with the other actions.

Method examples described herein may be implemented, at least in part, with nor or more machines or computing devices. Some examples may include a computer-readable medium or machine-readable medium encoded with instructions operable to configure an electronic device to perform methods as described in the examples disclosed herein. An example implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, without limitation, hard disks, removable magnetic disks, removable optical disks (e.g., compact disks and digital video disks), magnetic cassettes, memory cards or sticks, random access memory (RAM), read only memory (ROM), and the like.

The following examples pertain to further embodiments. The various features of the different embodiments may be variously combined with some features included and others excluded to suit a variety of different applications.

Some embodiments pertain to a system for transferring heat generated by internal electronic components of a mobile computer to its external environment, including: a cold plate adapted to be thermally coupled to and conduct heat from one or more electronic components; a heat pipe having a proximal portion in thermal contact with the cold plate and adapted to convey the conducted heat from the cold plate; and a ventilator assembly rotatably coupled to a distal portion of the heat pipe and adapted to dissipate the heat conveyed by the heat pipe.

In further embodiments, the ventilator assembly includes: a heat sink member disposed proximate the distal portion of the heat pipe and adapted to dissipate the heat conveyed by the heat pipe; and a deflector member disposed proximate the heat sink member and adapted to deflect the dissipation of the heat.

In further embodiments, the ventilator assembly is rotatably coupled about a longitudinal periphery of the distal portion of the heat pipe and adapted to dissipate the heat conveyed by the heat pipe by inducing an air flow perpendicular to the longitudinal periphery.

In further embodiments, the system is disposed within a housing and the ventilator assembly is adapted to dissipate the heat conveyed by the heat pipe by drawing in one or more air flows from one or more of a plurality of regions including within the housing, below the housing or behind the housing.

In further embodiments, further included is a mechanism adapted to establish an angle of rotation of the ventilator assembly in accordance with a selective engagement with the ventilator assembly.

In further embodiments, the mechanism includes: a member having a slotted surface disposed coaxially with an angle of rotation of the ventilator assembly; and a pin disposed longitudinally perpendicular to and adapted to be selectively engaged with the slotted surface.

In further embodiments, the mechanism includes: a receptacle member disposed coaxially with an angle of rotation of the ventilator assembly and having a central portion recessed within a coaxial peripheral portion that has a plurality of inwardly directed radial protrusions; and a plug member having a longitudinally protruding central portion that has a plurality of outwardly directed radial protrusions adapted to be selectively engaged with the plurality of inwardly directed radial protrusions.

Some embodiments pertain to a system for transferring heat generated by internal electronic components of a mobile computer to its external environment, including: first thermal conductor means for thermally coupling to and conducting heat from one or more electronic components; second thermal conductor means having a proximal portion for thermally contacting and conveying the conducted heat from the first thermal conductor means; and ventilator means for rotatably coupling to a distal portion of the second thermal conductor means and dissipating the heat conveyed by the second thermal conductor means.

In further embodiments, the ventilator means includes: heat sink means for disposition proximate the distal portion of the second thermal conductor means and dissipating the heat conveyed by the second thermal conductor means; and deflector means for disposition proximate the heat sink means and deflecting the dissipation of the heat.

In further embodiments, the ventilator means is further for rotatably coupling about a longitudinal periphery of the distal portion of the second thermal conductor means and dissipating the heat conveyed by the second thermal conductor means by inducing an air flow perpendicular to the longitudinal periphery.

In further embodiments, the system is disposed within a housing and the ventilator means is further for dissipating the heat conveyed by the second thermal conductor means by drawing in one or more air flows from one or more of a plurality of regions including within the housing, below the housing or behind the housing.

In further embodiments, further included is an engagement means for establishing an angle of rotation of the ventilator means by selectively engaging the ventilator means.

In further embodiments, the engagement means includes: receptacle means for disposition coaxially with an angle of rotation of the ventilator means; and plug means for selectively engaging with the receptacle means.

Some embodiments pertain to a method of transferring heat generated by internal electronic components of a mobile computer to its external environment, including: thermally coupling to and conducting, with a first thermal conductor, heat from one or more electronic components; thermally contacting and conveying, with a proximal portion of a second thermal conductor, the conducted heat from the first thermal conductor; and rotatably coupling to a distal portion of the second thermal conductor and dissipating, with a ventilator assembly, the heat conveyed by the second thermal conductor.

In further embodiments, the rotatably coupling to a distal portion of the second thermal conductor and dissipating, with a ventilator assembly, the heat conveyed by the second thermal conductor includes: disposing a heat sink proximate the distal portion of the second thermal conductor and dissipating, with the heat sink, the heat conveyed by the second thermal conductor; and deflecting, proximate the heat sink, the dissipation of the heat.

In further embodiments, the rotatably coupling to a distal portion of the second thermal conductor and dissipating, with a ventilator assembly, the heat conveyed by the second thermal conductor further includes rotatably coupling about a longitudinal periphery of the distal portion of the second thermal conductor and dissipating the heat conveyed by the second thermal conductor by inducing an air flow perpendicular to the longitudinal periphery.

In further embodiments, the rotatably coupling to a distal portion of the second thermal conductor and dissipating, with a ventilator assembly, the heat conveyed by the second thermal conductor includes drawing into a housing one or more air flows from one or more of a plurality of regions including within the housing, below the housing or behind the housing.

In further embodiments, further included is establishing an angle of rotation of the ventilator assembly by selectively engaging the ventilator assembly.

In further embodiments, the establishing an angle of rotation of the ventilator assembly by selectively engaging the ventilator assembly includes selectively engaging a plug with a receptacle disposed coaxially with the ventilator assembly.

The above description illustrates various embodiments of the present disclosure along with examples of how aspects of the particular embodiments may be implemented. The above examples should not be deemed to be the only embodiments and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. An apparatus including a system for transferring heat generated by internal electronic components of a mobile computer to its external environment, comprising:
   a cold plate adapted to be thermally coupled to and conduct heat from one or more electronic components in a main case of the mobile computer;
   a heat pipe having a proximal portion in thermal contact with said cold plate and adapted to convey said conducted heat from said cold plate; and
   a cooling assembly rotatably coupled to a distal portion of said heat pipe and adapted to dissipate said heat conveyed by said heat pipe, said cooling assembly comprising:
      an air inlet vent adapted to allow a first airflow to enter said cooling assembly,
      a heat sink member disposed proximate said distal portion of said heat pipe and adapted to dissipate said heat conveyed by said heat pipe,
      an air outlet vent adapted to allow exhaust of a mixed airflow from said cooling assembly, and
      a fan or blower including a deflector member disposed proximate said heat sink member, said fan or blower adapted to draw said first airflow from said air inlet vent and a second airflow over said cold plate, said deflector member adapted to redirect a mixed airflow, including said first airflow and said second airflow, and said heat dissipation of said heat through said air outlet vent,
   wherein the cooling assembly is rotatable away from a bottom of the main case of the mobile computer along an axis of rotation shared with a lid containing a display of the mobile computer.

2. The apparatus of claim 1, wherein said cooling assembly is rotatably coupled about a longitudinal periphery of said distal portion of said heat pipe and adapted to dissipate said heat conveyed by said heat pipe by inducing an air flow perpendicular to said longitudinal periphery.

3. The apparatus of claim 1, wherein said system is disposed within a housing and said cooling assembly is adapted to dissipate said heat conveyed by said heat pipe by drawing in one or more air flows from one or more of a plurality of regions including within said housing, below said housing or behind said housing.

4. The apparatus of claim 1, further comprising a mechanism adapted to establish an angle of rotation of said cooling assembly in accordance with a selective engagement with said cooling assembly.

5. The apparatus of claim 4, wherein said mechanism comprises:
   a member having a slotted surface disposed coaxially with an angle of rotation of said cooling assembly; and
   a pin disposed longitudinally perpendicular to and adapted to be selectively engaged with said slotted surface.

6. The apparatus of claim 4, wherein said mechanism comprises:
   a receptacle member disposed coaxially with an angle of rotation of said cooling assembly and having a central portion recessed within a coaxial peripheral portion that has a plurality of inwardly directed radial protrusions; and
   a plug member having a longitudinally protruding central portion that has a plurality of outwardly directed radial protrusions adapted to be selectively engaged with said plurality of inwardly directed radial protrusions.

7. An apparatus including a system for transferring heat generated by internal electronic components of a mobile computer to its external environment, comprising:
   first thermal conductor means for thermally coupling to and conducting heat from one or more electronic components in a main case of the mobile computer;
   second thermal conductor means having a proximal portion for thermally contacting and conveying said conducted heat from said first thermal conductor means; and
   cooling means for rotatably coupling to a distal portion of said second thermal conductor means and dissipating said heat conveyed by said second thermal conductor means, said cooling means comprising:
      air inlet means for allowing a first airflow to enter said cooling means,
      heat sink means for disposition proximate said distal portion of said second thermal conductor means and for dissipating said heat conveyed by said heat pipe,
      air outlet means for exhausting a mixed airflow from a cooling assembly, and
      air blowing means comprising deflector means for disposition proximate to said heat sink means, said air blowing means for drawing said first airflow from an air inlet vent and a second airflow over a cold plate, said deflector means for redirecting a mixed airflow, including said first airflow and said second airflow, and said heat dissipation of said heat through said air outlet vent,
   wherein the cooling assembly is rotatable away from a bottom of the main case of the mobile computer along an axis of rotation shared with a lid containing a display of the mobile computer.

8. The apparatus of claim 7, wherein said cooling means is further for rotatably coupling about a longitudinal periphery of said distal portion of said second thermal conductor means and dissipating said heat conveyed by said second thermal conductor means by inducing an air flow perpendicular to said longitudinal periphery.

9. The apparatus of claim 7, wherein said system is disposed within a housing and said cooling means is further for dissipating said heat conveyed by said second thermal conductor means by drawing in one or more air flows from one or more of a plurality of regions including within said housing, below said housing or behind said housing.

10. The apparatus of claim 7, further comprising an engagement means for establishing an angle of rotation of said cooling means by selectively engaging said cooling means.

11. The apparatus of claim 10, wherein said engagement means comprises:
   receptacle means for disposition coaxially with an angle of rotation of said cooling means; and
   plug means for selectively engaging with said receptacle means.

12. A method of transferring heat generated by internal electronic components of a mobile computer to its external environment, comprising:

thermally coupling to and conducting, with a first thermal conductor, heat from one or more electronic components in a main case of the mobile computer;

thermally contacting and conveying, with a proximal portion of a second thermal conductor, said conducted heat from said first thermal conductor;

rotatably coupling to a distal portion of said second thermal conductor and dissipating, with a cooling assembly, said heat conveyed by said second thermal conductor;

disposing a heat sink proximate said distal portion of said second thermal conductor;

drawing a first airflow from an air inlet vent of said cooling assembly;

drawing a second airflow over said one or more electronic components in said main case;

dissipating, with said heat sink, said heat conveyed by said second thermal conductor; and deflecting a mixed airflow, including said first airflow and said second airflow, and said dissipation of said heat through an air outlet vent of said cooling assembly, wherein the cooling assembly is rotatable away from a bottom of the main case of the mobile computer along an axis of rotation shared with a lid containing a display of the mobile computer.

13. The method of claim 12, wherein said rotatably coupling to a distal portion of said second thermal conductor and dissipating, with a cooling assembly, said heat conveyed by said second thermal conductor further comprises rotatably coupling about a longitudinal periphery of said distal portion of said second thermal conductor and dissipating said heat conveyed by said second thermal conductor by inducing an air flow perpendicular to said longitudinal periphery.

14. The method of claim 12, wherein said rotatably coupling to a distal portion of said second thermal conductor and dissipating, with a cooling assembly, said heat conveyed by said second thermal conductor comprises drawing into a housing one or more air flows from one or more of a plurality of regions including within said housing, below said housing or behind said housing.

15. The method of claim 12, further comprising establishing an angle of rotation of said cooling assembly by selectively engaging said cooling assembly.

16. The method of claim 15, wherein said establishing an angle of rotation of said cooling assembly by selectively engaging said cooling assembly comprises selectively engaging a plug with a receptacle disposed coaxially with said cooling assembly.

* * * * *